US012703914B2

(12) United States Patent
Nagata et al.

(10) Patent No.: US 12,703,914 B2
(45) Date of Patent: Aug. 11, 2026

(54) METHOD FOR FORMING SILICON OXIDE FILM

(71) Applicants: Air Water Inc., Osaka (JP); Air Water Performance Chemical Inc., Kanagawa (JP)

(72) Inventors: Keisuke Nagata, Matsumoto (JP); Yosuke Ebihara, Matsumoto (JP); Hiroyuki Honda, Matsumoto (JP)

(73) Assignees: AIR WATER INC., Osaka (JP); AIR WATER PERFORMANCE CHEMICAL INC., Kanagawa (JP)

(*) Notice: Subject to any disclaimer, the term of this patent is extended or adjusted under 35 U.S.C. 154(b) by 0 days.

(21) Appl. No.: 19/115,866

(22) PCT Filed: Sep. 27, 2023

(86) PCT No.: PCT/JP2023/035156
§ 371 (c)(1),
(2) Date: Mar. 27, 2025

(87) PCT Pub. No.: WO2024/071205
PCT Pub. Date: Apr. 4, 2024

(65) Prior Publication Data

US 2026/0110088 A1 Apr. 23, 2026

(30) Foreign Application Priority Data

Sep. 28, 2022 (JP) ................................ 2022-154751

(51) Int. Cl.
*C23C 16/455* (2006.01)
*C23C 16/40* (2006.01)
*C23C 16/44* (2006.01)

(52) U.S. Cl.
CPC ...... *C23C 16/45553* (2013.01); *C23C 16/401* (2013.01); *C23C 16/4408* (2013.01)

(58) Field of Classification Search
CPC ........... C23C 16/45553; C23C 16/401; C23C 16/4408
See application file for complete search history.

(56) References Cited

U.S. PATENT DOCUMENTS

2008/0286628 A1 11/2008 Briehn et al.
2013/0295779 A1 11/2013 Chandra et al.
(Continued)

FOREIGN PATENT DOCUMENTS

JP 2018014536 A 1/2018
JP 2019507750 A 3/2019
(Continued)

OTHER PUBLICATIONS

International Search Report issued Dec. 26, 2023 in International Application No. PCT/JP2023/035156.

*Primary Examiner* — Michael G Miller
(74) *Attorney, Agent, or Firm* — Panitch Schwarze Belisario & Nadel LLP

(57) ABSTRACT

A method for forming a silicon oxide film, containing:

a provision step of providing a substrate in a reactor;
a first introduction step of introducing, into the reactor, at least one silicon compound represented by Formula (1);
a first purge step of purging the reactor with purge gas;
a second introduction step of introducing an oxygen source into the reactor; and
a second purge step of purging the reactor with the purge gas,
in which the first introduction step, the first purge step, the second introduction step, and the second purge step are performed at a temperature of 650° C. or more and 800° C. or less and a pressure of 7.6 Pa or more and 100 kPa or less.

3 Claims, 4 Drawing Sheets

(56) References Cited

U.S. PATENT DOCUMENTS

| | | | |
|---|---|---|---|
| 2016/0365244 A1 | 12/2016 | Chandra et al. | |
| 2017/0256399 A9 | 9/2017 | Chandra et al. | |
| 2019/0189431 A1 | 6/2019 | Chandra et al. | |
| 2020/0105589 A1* | 4/2020 | Tsai | H10D 62/822 |
| 2021/0363639 A1* | 11/2021 | Wang | C23C 16/45553 |

FOREIGN PATENT DOCUMENTS

| | | |
|---|---|---|
| JP | 2022504248 A | 1/2022 |
| WO | 2017136945 A1 | 8/2017 |
| WO | 2020072768 A1 | 4/2020 |
| WO | 2021050368 A1 | 3/2021 |

* cited by examiner

METHOD FOR FORMING SILICON OXIDE FILM

CROSS-REFERENCE TO RELATED APPLICATIONS

This application is a Section 371 of International Application No. PCT/JP2023/035156, filed Sep. 27, 2023, which was published in the Japanese language on Apr. 4, 2024 under International Publication No. WO 2024/071205 A1, which claims priority under 35 U.S.C. § 119(b) to Japanese Application No. 2022-154751, filed Sep. 28, 2022, the disclosures of which are incorporated herein by reference in their entireties.

BACKGROUND ART

As NAND flash memory cells are increasingly assembled three-dimensionally, film deposition of silicon oxide at high temperature (650° C. or more) is increasingly required for forming high-quality insulating films having high adhesion and satisfactory coatability.

Chemical vapor deposition (CVD) has been mainly applied as a method for forming films of silicon oxide at high temperature. Unfortunately, CVD is not suitable for depositing films having high adhesion and satisfactory coatability since CVD is a method for depositing films using chemical reaction and pyrolysis. Since CVD does not enable film deposition on fine patterns, CVD cannot be adopted for fine portions.

Accordingly, formation of a silicon oxide film has been examined by atomic layer deposition (ALD), which enables high-quality film deposition in the high temperature range (for example, PTLs 1 to 3).

CITATION LIST

Patent Literature

PTL 1: Japanese Patent Laying-Open No. 2018-14536

PTL 2: Japanese National Patent Publication No. 2019-507750

PTL 3: WO 2021/050368

SUMMARY OF INVENTION

Technical Problem

The present disclosure is directed to providing a method for forming a silicon oxide film from a silicon compound having high heat resistance by atomic layer deposition.

Solution to Problem

[1] A method for forming a silicon oxide film, comprising:

a provision step of providing a substrate in a reactor;

a first introduction step of introducing, into the reactor, at least one silicon compound represented by the following Formula (1);

a first purge step of purging the reactor with purge gas;

a second introduction step of introducing an oxygen source into the reactor; and a second purge step of purging the reactor with the purge gas, wherein the first introduction step, the first purge step, the second introduction step, and the second purge step are performed at a temperature of 650° C. or more and 800° C. or less and a pressure of 7.6 Pa or more and 100 kPa or less:

[Chem. 1]

Formula (1)

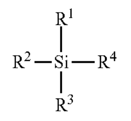

wherein, in Formula (1), $R^1$ is a methoxy group or an ethoxy group, $R^2$ is a hydrogen atom, a methyl group, an ethyl group, a methoxy group, or an ethoxy group, $R^3$ is a hydrogen atom, a methyl group, an ethyl group, a methoxy group, an ethoxy group, or a group represented by the following Formula (2) or (3), and $R^4$ is a group represented by the following Formula (2) or (3):

[Chem. 2]

Formula (2)

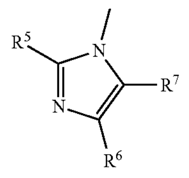

[Chem. 3]

Formula (3)

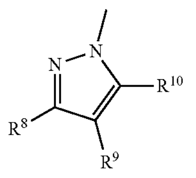

wherein, in Formulae (2) and (3), $R^5$ to $R^{10}$ are each independently a hydrogen atom, a methyl group, or an ethyl group.

[2] The method for forming a silicon oxide film according to [1], wherein, in Formula (1), $R^1$ to $R^3$ are methoxy groups, and $R^4$ is a group represented by Formula (3).

[3] The method for forming a silicon oxide film according to [1] or [2], wherein the first introduction step, the first purge step, the second introduction step, and the second purge step are repeated.

Advantageous Effects of Invention

The present disclosure enables providing a method for forming a silicon oxide film from a silicon compound having high heat resistance by atomic layer deposition.

DESCRIPTION OF EMBODIMENTS

Hereinafter, embodiments of the present disclosure will be described. The following description does not, however, limit the scope of claims.

<Method for Forming Silicon Oxide Film>

A method for forming a silicon oxide film, comprises a provision step of providing a substrate in a reactor, a first introduction step of introducing at least one silicon compound represented by the following Formula (1) into the reactor, a first purge step of purging the reactor with purge gas, a second introduction step of introducing an oxygen source into the reactor, and a second purge step of purging the reactor with the purge gas. The first introduction step, the first purge step, the second introduction step, and the second purge step are performed at a temperature of 650° C. or more and 800° C. or less and a pressure of 7.6 Pa or more and 100 kPa or less.

[Chem. 4]

Formula (1)

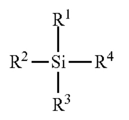

In Formula (1), $R^1$ is a methoxy group or an ethoxy group, $R^2$ is a hydrogen atom, a methyl group, an ethyl group, a methoxy group, or an ethoxy group, $R^3$ is a hydrogen atom, a methyl group, an ethyl group, a methoxy group, an ethoxy group, or a group represented by the following Formula (2) or (3), and $R^4$ is a group represented by the following Formula (2) or (3).

[Chem. 5]

Formula (2)

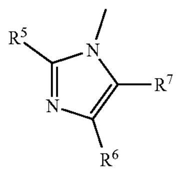

[Chem. 6]

Formula (3)

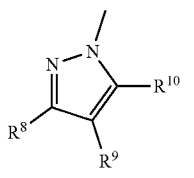

In Formulae (2) and (3), $R^5$ to $R^{10}$ are each independently a hydrogen atom, a methyl group, or an ethyl group.

Figure 1:
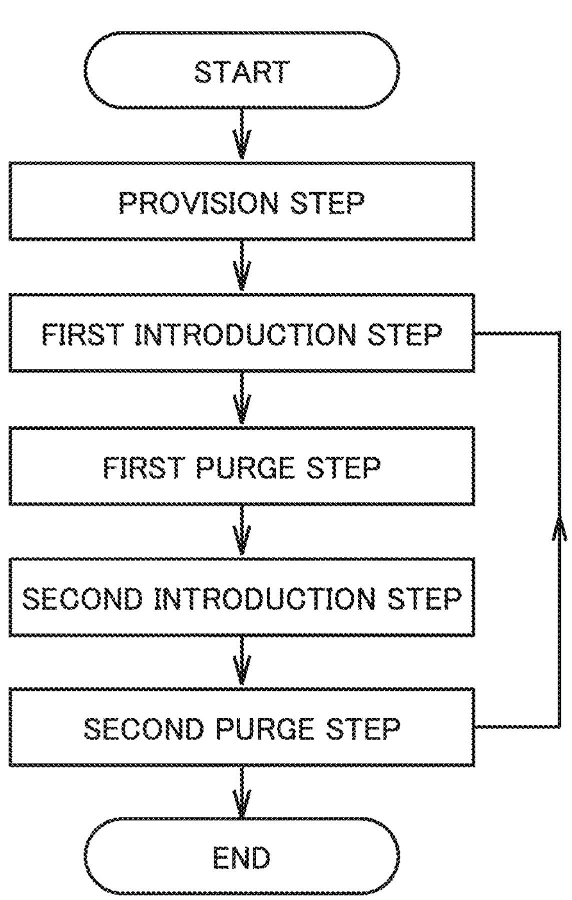
FIG. 1 is a schematic flow chart of a method for forming a silicon oxide film in the present embodiment.

FIG. 1 is a schematic flow chart of a method for forming a silicon oxide film in the present embodiment. Hereinafter, the steps of the method for forming a silicon oxide film will be described.

ALD includes two types of ALD, thermal ALD and plasma ALD. The present disclosure uses thermal ALD, which enables high-quality film deposition in the high temperature range.

(Provision Step)

In the provision step, the substrate is provided in the reactor.

As long as the substrate used for the present disclosure enables the silicon compound as the precursor to grow thereon, the substrate may be any substrate. Examples thereof include ceramic substrates such as a silicon substrate, a silicon oxide substrate, and a silicon nitride substrate. Among these, a silicon substrate or a silicon oxide substrate is preferably used from the viewpoint of high-quality film deposition.

(First Introduction Step)

In the first introduction step, the at least one silicon compound represented by the above-mentioned Formula (1) is introduced into the reactor. In this step, the silicon compound as the precursor is adsorbed on the surface of the substrate.

The silicon compound may be introduced into the reactor with carrier gas. The carrier gas as used herein means inert gas that promotes the feeding of the silicon compound into the reactor. The carrier gas is not reacted with the silicon compound. Examples of the carrier gas include hydrogen ($H_2$), helium (He), nitrogen ($N_2$), neon (Ne), and Argon (Ar).

In the above-mentioned Formula (1), $R^1$ is a methoxy group or an ethoxy group; $R^2$ is a hydrogen atom, a methyl group, an ethyl group, a methoxy group, or an ethoxy group; $R^3$ is a hydrogen atom, a methyl group, an ethyl group, a methoxy group, or a group represented by the above-mentioned Formula (2) or (3); and $R^4$ is a group represented by the above-mentioned Formula (2) or (3).

Such a compound can be a useful precursor in the formation of a silicon oxide film. Examples of the silicon compound represented by Formula (1) include a structure represented by the following Formula (4).

[Chem. 7]

Formula (4)

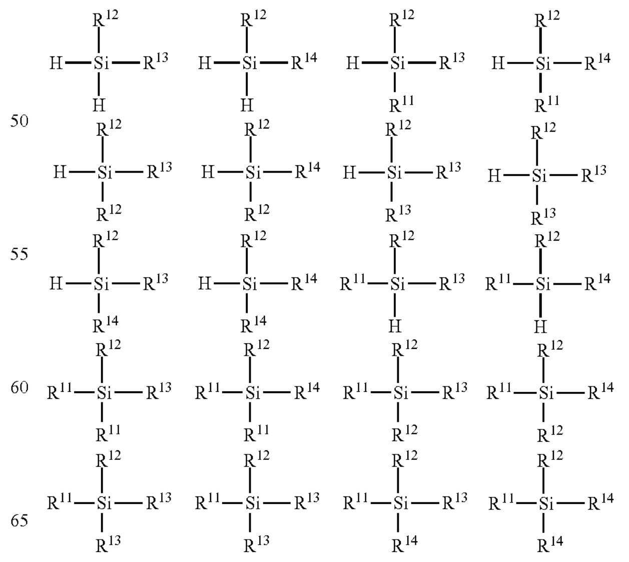

-continued

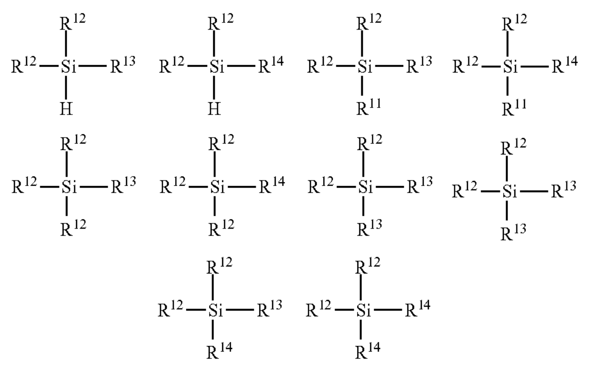

In Formula (4), $R^{11}$ is a methyl group or an ethyl group, $R^{12}$ is a methoxy group or an ethoxy group, $R^{13}$ is any one of the structures represented by the following Formula (5), and $R^{14}$ is any one of structures represented by the following Formula (6). $R^{11}$ in the following Formulae (5) and (6) is the same group as mentioned above.

[Chem. 8]

Formula (5)

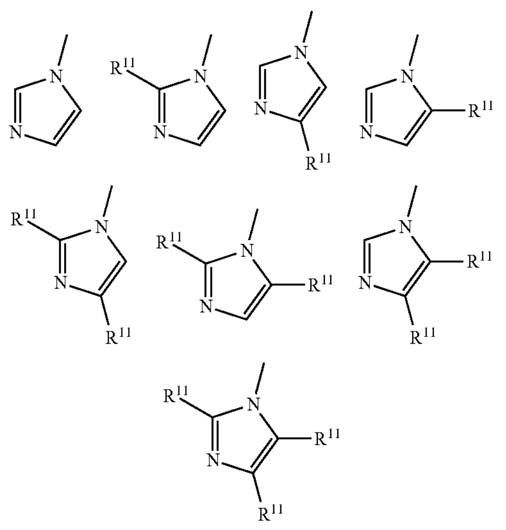

[Chem. 9]

Formula (6)

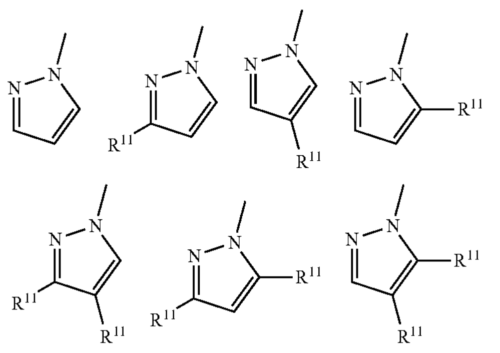

-continued

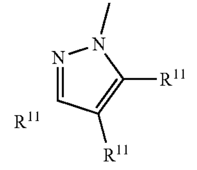

The silicon compound represented by the above-mentioned Formula (1) is preferably 3-methylpyrazolyltrimethoxysilane, represented by the following Formula (7), or 2-methylimidazolyltrimethoxysilane, represented by the following formula (8), from the viewpoint of heat resistance.

[Chem. 10]

Formula (7)

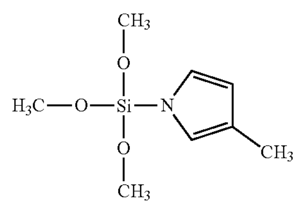

[Chem. 11]

Formula (8)

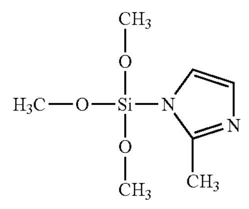

This step only has to be performed at a sufficient flow rate for sufficient time to enable adsorbing the silicon compound on the surface of the substrate. This step may be performed, for example, for 0.1 seconds or more and 1000 seconds or less. The silicon compound in this step may be introduced into the reactor at a flow rate of 1 sccm or more and 2000 sccm or less. The unit of the flow rate "sccm (standard cubic centimeter per minute)" means a flow rate expressed in "mL/min" under the standard conditions (0° C. and 101.3 kPa).

(First Purge Step)

In the first purge step, the reactor after the first introduction step is purged with purge gas. This step is a step of removing an excess silicon compound not adsorbed on the substrate in the first introduction step.

As the purge gas, inert gas can be used that enables removing the silicon compound as the precursor. The purge gas is not reacted with the silicon compound. Examples of the purge gas as the inert gas include the same gases as the carrier gas described above.

This step only has to be performed at a sufficient flow rate for sufficient time to enable removing an excess silicon compound. For example, this step may be performed, for example, for 0.1 seconds or more and 1000 seconds or less. The purge gas in this step may be introduced into the reactor, for example, at 10 sccm or more and 2000 sccm or less.

(Second Introduction Step)

In the second introduction step, the oxygen source is introduced into the reactor. This step is a step of reacting the silicon compound as the precursor adsorbed on the surface of the substrate with the oxygen source to form the silicon oxide film.

Examples of the oxygen source include, but not particularly limited to, water, oxygen ($O_2$), peroxides, oxygen plasma, ozone ($O_3$), dinitrogen monoxide ($N_2O$), nitrogen dioxide ($NO_2$), carbon monoxide (CO), carbon dioxide ($CO_2$), and combinations thereof.

This step only has to be performed at a sufficient flow rate for sufficient time to enable reacting the silicon compound with the oxygen source. This step may be performed, for example, for 0.1 seconds or more and 100 seconds or less. The oxygen source in this step may be introduced, for example, at a flow rate of 1 sccm or more and 2000 sccm or less.

(Second Purge Step)

In the second purge step, the reactor after the second introduction step is purged with the purge gas. This step is a step of removing the oxygen source not reacted with the silicon compound in the second introduction step.

Since this step is performed while the same purge gas is made to flow at the same flow rate for the same time as in the first purge, details thereof are omitted.

(from the First Introduction Step to the Second Purge Step)

The first introduction step, the first purge step, the second introduction step, and the second purge step are performed at a temperature of 650° C. or more and 800° C. or less. If the first introduction step, the first purge step, the second introduction step, and the second purge step are performed at a temperature of 650° C. or more and 800° C. or less, a film can be deposited having high adhesion and satisfactory coatability. The first introduction step, the first purge step, the second introduction step, and the second purge step are preferably performed at a temperature of 650° C. or more and 750° C. or less.

The first introduction step, the first purge step, the second introduction step, and the second purge step are performed at a pressure of 7.6 Pa or more and 100 kPa or less. If the first introduction step, the first purge step, the second introduction step, and the second purge step are performed at a pressure of 7.6 Pa or more and 100 kPa or less, a film can be deposited having high adhesion and satisfactory coatability. The first introduction step, the first purge step, the second introduction step, and the second purge step are preferably performed at a pressure of 10 Pa or more and 1 kPa or less.

The first introduction step, the first purge step, the second introduction step, and the second purge step may be repeated. The first introduction step, the first purge step, the second introduction step, and the second purge step can be repeated to obtain a silicon oxide film having a desired thickness.

<Film Deposition Apparatus>

Figure 2:
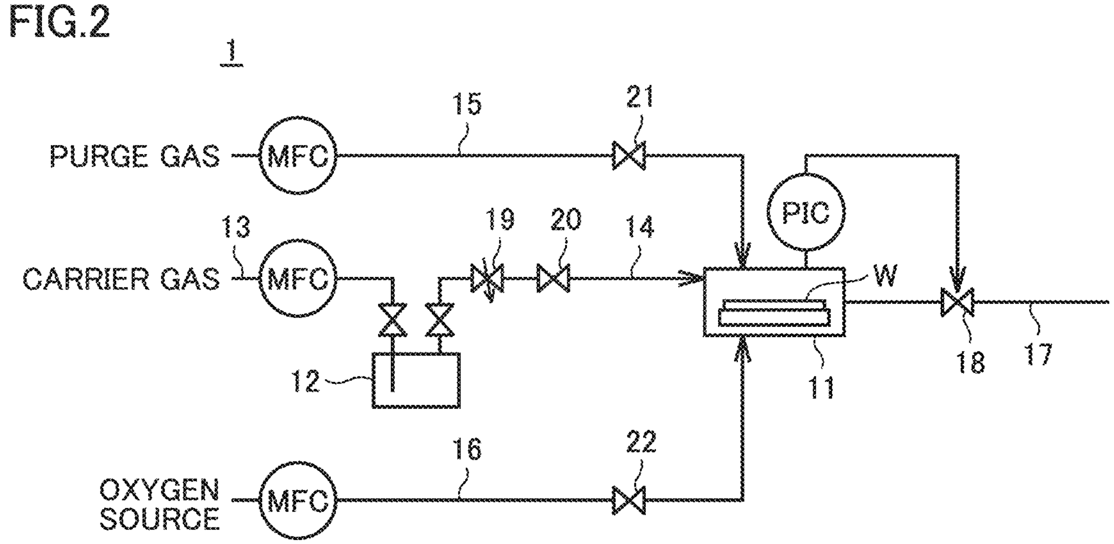
FIG. 2 is a conceptual diagram showing an exemplary film-forming apparatus applicable to the method for forming a silicon oxide film in the present embodiment.

With reference to FIG. 2, an exemplary film deposition apparatus applicable to a method for forming a silicon oxide film in the present embodiment will be described. A film deposition apparatus 1 includes at least a reactor 11 for storing a substrate W as an object to be treated, a precursor gas feed channel 14 for feeding the silicon compound as a precursor, a purge gas feed channel 15 for feeding a purge gas, and an oxygen source feed channel 16 for feeding an oxygen source, and a discharge channel 17 for discharging the atmosphere in the reactor 11.

Reactor 11 has a hermetically sealed structure, which enables isolating the contents therein from the open air. Reactor 11 is configured to be able to contain the substrate W as it is maintained horizontally, for example, with help of a boat. Reactor 11 may include a heating mechanism (not shown) that can heat the substrate W contained therein to predetermined temperature. Examples of an adoptable heating mechanism include, but not particularly limited to, known heating mechanisms such as heaters.

A precursor feeder 12 has the function of feeding the precursor to the reactor 11. Precursor feeder 12 stores a liquid or solid precursor. A carrier gas feed channel 13 for introducing the carrier gas is connected to precursor feeder 12. The flow rate of the carrier gas to be fed from carrier gas feed channel 13 can be controlled with a MFC (mass flow controller).

A precursor gas feed channel 14 is disposed between precursor feeder 12 and reactor 11. The liquid or solid precursor contained in precursor feeder 12 is gasified into precursor gas, which is fed to reactor 11. Precursor gas feed channel 14 is provided with a needle valve 19 and an on-off valve 20. Needle valve 19 regulates the flow rate of the gas flowing through precursor gas feed channel 14. On-off valve 20 controls the feeding or stop of the gas flowing through precursor gas feed channel 14.

Purge gas feed channel 15 has the function of feeding the purge gas to reactor 11. Purge gas feed channel 15 is connected to reactor 11. The flow rate of the purge gas to be fed can be controlled with an MFC. Purge gas feed channel 15 is provided with an on-off valve 21. On-off valve 21 controls the feeding or stop of the purge gas flowing through purge gas feed channel 15.

Oxygen source feed channel 16 has the function of feeding the oxygen source to reactor 11. Oxygen source feed channel 16 is connected to reactor 11. The flow rate of the oxygen source to be fed can be controlled with an MFC. Oxygen source feed channel 16 is provided with an on-off valve 22. On-off valve 22 controls the feeding or stop of the oxygen source flowing through oxygen source feed channel 16.

Discharge channel 17 has the function of discharging the atmosphere in reactor 11. Discharge channel 17 is connected to the reactor 11. Discharge channel 17 is connected to a pressure sensor (not shown) as a pressure detector for detecting the pressure in reactor 11, an APC (automatic pressure control) valve 18 as a pressure controller for controlling the pressure in reactor 11, and a vacuum pump (not shown) as an evacuation device. The opening or closing of APC valve 18 is regulated by PID (proportional-integral-differential controller) control based on measurement by the pressure sensor while the vacuum pump operated. The pressure in reactor 11 is spontaneously regulated thereby.

The discharged gas from discharge channel 17 may contain toxic gas or flammable gas. Discharge channel 17 may therefore be provided, for example, with a water scrubber, a sulfuric acid scrubber, a caustic scrubber, or a dry detoxification device to make the discharged gas nontoxic and releasable to the atmosphere.

EXAMPLES

Hereinafter, Examples will be described. The following examples do not, however, limit the scope of claims.

The apparatuses shown below were used in the present Examples. Note that a gas chromatograph is abbreviated as "GC", and a gas chromatograph-mass spectrometer is abbreviated as "GC-MS". In the present Examples, a film deposition apparatus was used having a configuration shown in FIG. 2.

GC: GC-2025AF, which is available from SHIMADZU CORPORATION

GC-MS: MSQP2020NX, which is available from SHIMADZU CORPORATION

The reagents and others shown below were used in the present Examples.

n-butyllithium: Product available from KANTO CHEMICAL CO., INC.

3-Methylpyrazole: Product available from Tokyo Chemical Industry (TCI) Co., Ltd.

Tetrahydrofuran: Product available from FUJIFILM Wako Pure Chemical Corporation

2-Methylimidazole: Product available from TCI Co., Ltd.

Triethylamine: Product available from TCI Co., Ltd.

Chlorotrimethoxysilane: Product available from TCI Co., Ltd.

Example 1

Silicon oxide films were formed from 3-methylpyrazolyltrimethoxysilane, represented by the above-mentioned Formula (7), by atomic layer deposition.

(Preparation)

First, 13.32 g of 3-methylpyrazole dried under vacuum and 100 mL of tetrahydrofuran were added to a 1-L flask in a $N_2$ atmosphere. Then, 100 mL of n-butyllithium (1.6 mol/L) solution was added, followed by stirring for 1 hour. After the stirring, 29.13 g of chlorotrimethoxysilane and 200 mL of the above-mentioned n-butyllithium solution were further added, and the mixture was stirred for 12 hours. The stirred mixture was passed through a filter to collect a liquid product. The solvent was removed from the liquid product under vacuum. The obtained liquid was then distilled under reduced pressure for purification in a glove box. The analysis using the above-mentioned GC-MS has confirmed that the product is 3-methylpyrazolyltrimethoxysilane. The analysis using the above-mentioned GC has confirmed that the purity is 96.5%.

(Formation)

A silicon substrate as a substrate was disposed in the reactor of the above-mentioned film deposition apparatus. Then, 3-methylpyrazolyltrimethoxysilane was introduced into the reactor with $N_2$ gas as carrier gas. The reactor was purged with $N_2$ gas as purge gas. $O_3$ as an oxygen source was introduced into the reactor. The reactor was purged with $N_2$ gas as purge gas. The first introduction step was performed under the conditions shown in Table 1 for 1 second, 10 seconds, 23 seconds, and 44 seconds, respectively, the other steps were performed under the conditions shown in Table 1, and this procedure was performed 100 cycles.

TABLE 1

| | Temperature (° C.) | Pressure (Pa) | Time (second) | Flow rate (sccm) |
|---|---|---|---|---|
| First introduction step | 650 | 100 | — | 50*[1] |
| First purge step | 650 | 100 | 12 | 200 |
| Second introduction step | 650 | 130 | 20 | 200 |
| Second purge step | 650 | 100 | 12 | 200 |

*[1]Flow rate of carrier gas

Example 2

Silicon oxide films were formed from 2-methylimidazolyltrimethoxysilane, represented by the above-mentioned Formula (8), by atomic layer deposition.

(Preparation)

First, 34.3 g of 2-methylimidazole dried under vacuum, 1000 mL of tetrahydrofuran, and 52.9 g of dehydrated triethylamine were added to a 2-L flask in a $N_2$ atmosphere, followed by cooling in an ice bath for 0.5 hours. After the cooling, a mixed solution of 76.0 g of chlorotrimethoxysilane and 512 mL of tetrahydrofuran was dropped, and the mixture was stirred for 12 hours. The stirred mixture was filtered in a glove box to collect a liquid product. The solvent was removed from the liquid product under vacuum. The obtained liquid was then distilled under reduced pressure for purification in a glove box. The analysis using the above-mentioned GC-MS has confirmed that the product is 2-methylimidazolyltrimethoxysilane. The analysis using the above-mentioned GC has confirmed that the purity is 99.2%.

(Formation)

The silicon oxide films were formed using the same substrate, the same carrier gas, the same purge gas, and the same oxygen source as in Example 1 except that the above-mentioned 2-methylimidazolyltrimethoxysilane was used. The first introduction step was performed under the conditions shown in Table 2 for 25 seconds, 60 seconds, and 119 seconds, respectively, the other steps were performed under the conditions shown in Table 2, and this procedure was performed 100 cycles.

TABLE 2

| | Temperature (° C.) | Pressure (Pa) | Time (second) | Flow rate (sccm) |
|---|---|---|---|---|
| First introduction step | 650 | 667 | — | 50*[1] |
| First purge step | 650 | 667 | 12 | 200 |
| Second introduction step | 650 | 1333 | 20 | 200 |
| Second purge step | 650 | 667 | 12 | 200 |

*[1]Flow rate of carrier gas

Comparative Example 1

Atomic layer deposition of silicon oxide films were conducted using dimethylaminotrimethylsilane (DMATMS). DMATMS was available from TCI Co., Ltd.

The silicon oxide films were formed using the same substrate, the same carrier gas, the same purge gas, and the same oxygen source as in Example 1 except that the above-mentioned DMATMS was used. The first introduction step was performed under the conditions shown in Table 3 for 9 seconds, 15 seconds, 20 seconds, and 120 seconds, respectively, the other steps were performed under the conditions shown in Table 3, and this procedure was performed 100 cycles.

TABLE 3

| | Temperature (° C.) | Pressure (Pa) | Time (second) | Flow rate (sccm) |
|---|---|---|---|---|
| First introduction step | 650 | 50 | — | 50*[1] |
| First purge step | 650 | 100 | 12 | 200 |
| Second introduction step | 650 | 130 | 20 | 200 |
| Second purge step | 650 | 100 | 12 | 200 |

*[1]Flow rate of carrier gas

<Evaluation>

(Minimum Bond Dissociation Energy)

The minimum bond dissociation energies (MBDE) of the silicon compounds used in Example 1 and Comparative Example 1 were calculated. The MBDE refers to BDE exhibiting the lowest value among BDEs, which are energies required for cleaving specific chemical bonds. The MBDE corresponds to the BDE of the weakest bond in a molecule. It is meant that as the value of the energy increases, the molecule becomes higher in heat resistance. The MBDE was determined by a Gaussian 16, a quantum chemistry calculation program available from Gaussian, Inc. In Example 1, the bond dissociation energy between oxygen and the methyl group binding to oxygen was the MBDE. In Comparative Example 1, the bond dissociation energy between nitrogen and the methyl group binding to nitrogen was the MBDE. Table 4 shows the results.

TABLE 4

| | Example 1 | Comparative Example 1 |
|---|---|---|
| MBDE(kJ/mol) | 397 | 348 |

(Rate of Growth)

Figure 3:
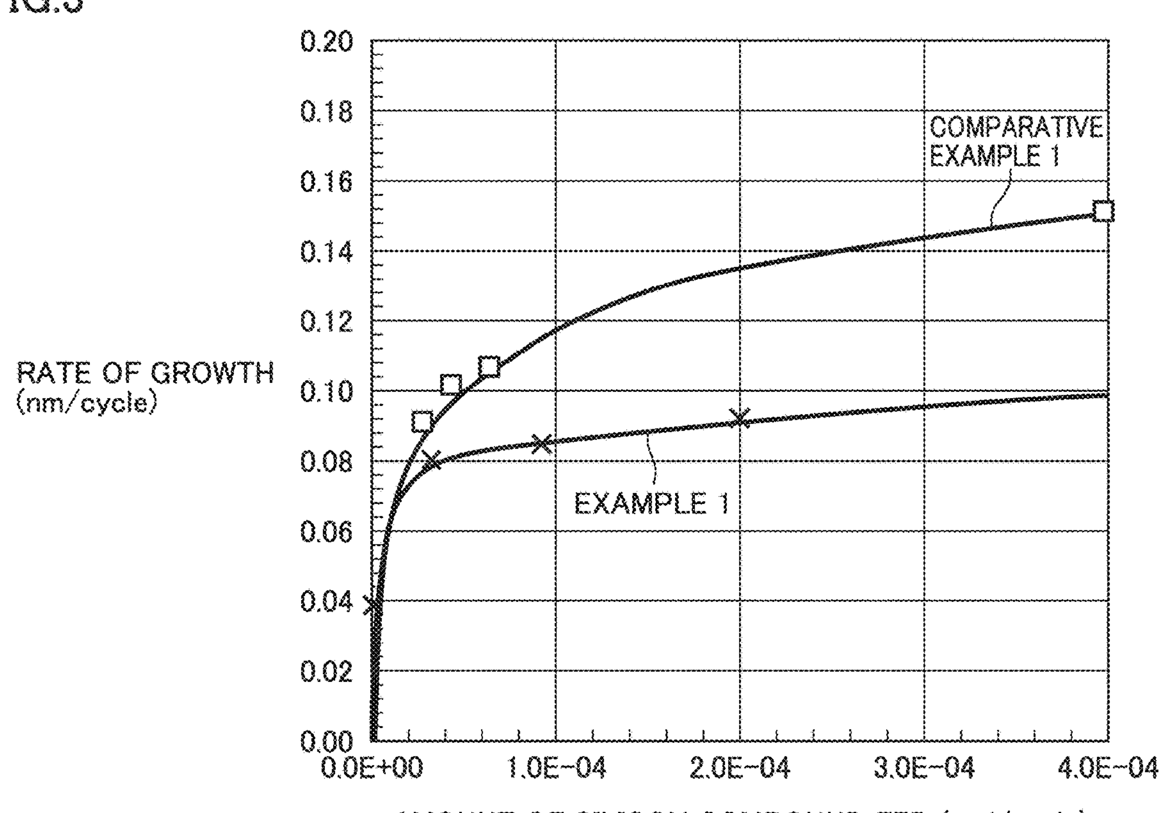
FIG. 3 is graphs showing the relationships between the amounts of the silicon compounds fed and the rates of growth of silicon oxide films in Example 1 in the present embodiment and Comparative Example 1, respectively.
Figure 4:
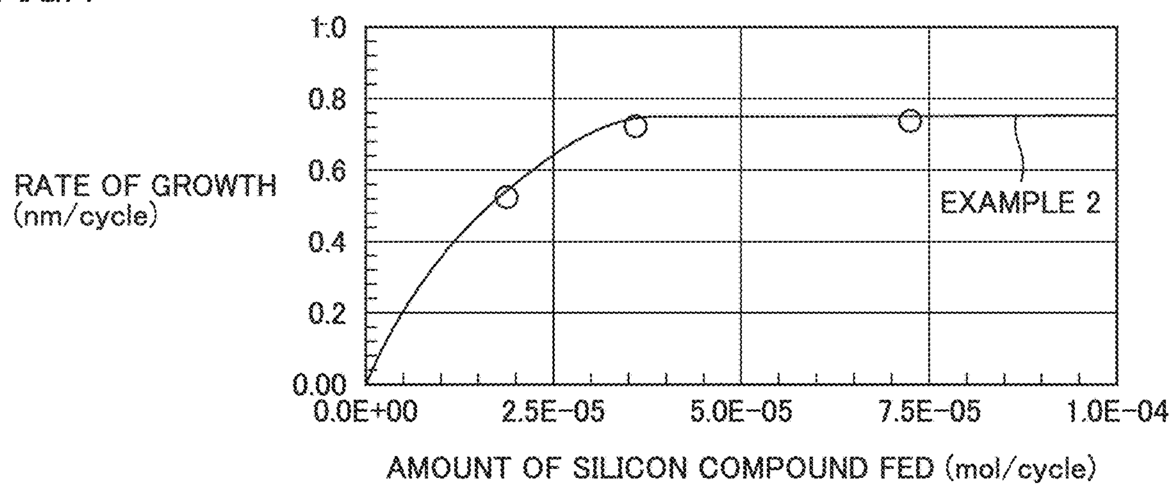
FIG. 4 is a graph showing the relationship between the amount of the silicon compound fed and the rate of growth of a silicon oxide film in Example 2 in the present embodiment.

The rate of growth of the silicon oxide films of Examples 1 to 2 and Comparative Example 1 were calculated. The rate of growth means the growth of a silicon oxide film relative to the amount of the silicon compound fed, and the rate is used as an index of ALD. If the rate of growth of the silicon oxide film reaches the saturation point with an increase in the amount fed, it can be said that the silicon oxide film is formed by ALD. The rate of growth was calculated from the amount of the film deposited per cycle. FIGS. 3 and 4 show the results. In FIG. 3, the graph of Example 1 is derived by plotting crosses as the rates of growth at times of 1 second, 10 seconds, 23 seconds, and 44 seconds spent in the first introduction step, respectively. The graph of Comparative Example 1 is derived by plotting squares as the rates of growth at times of 9 seconds, 15 seconds, 20 seconds, and 120 seconds spent in the first introduction step, respectively. In FIG. 4, the graph of Example 2 is derived by plotting circles as the rates of growth at times of 25 seconds, 60 seconds, and 119 seconds spent in the first introduction step, respectively.

Results

Table 3 has confirmed that 3-methylpyrazolyltrimethoxysilane, which is the silicon compound of Example 1, has a higher MBDE than DMATMS, which is the silicon compound of Comparative Example 1. This shows that 3-methylpyrazolyltrimethoxysilane, which is the silicon compound of Example 1, has high heat resistance.

The results of FIGS. 3 and 4 have confirmed that, in Example 1, the curve of the rate of growth becomes flat, namely saturated, with an increase in the amount of 3-methylpyrazolyltrimethoxysilane fed. It is confirmed that, in Example 2, the curve of the rate of growth also becomes flat, namely saturated, with an increase in the amount of 2-methylimidazolyltrimethoxysilane fed in the same way. This shows that, in Examples 1 to 2, the silicon oxide films are formed by ALD. In Comparative Example 1, the curve of the rate of growth does not meanwhile become flat with an increase in the amount of DMATMS fed. It is conceivable that this results from the coexistence of films deposited by CVD.

Embodiments and Examples disclosed this time should be considered to be illustrative in all respects and unlimited. It is intended that the scope of the present invention be indicated by the scope of claims rather than by the above-mentioned description, and include all modifications within the meaning and the scope equivalent to the scope of claims.

REFERENCE SIGNS LIST

1 Film deposition apparatus; 11 Reactor; 12 Precursor feeder; 13 Carrier gas feed channel; 14 Precursor gas feed channel; 15 Purge gas feed channel; 16 Oxygen source feed channel; 17 Discharge channel; 18 APC valve; 19 Needle valve; 20, 21, 22 On-off valve.

The invention claimed is:

1. A method for forming a silicon oxide film, comprising:

a provision step of providing a substrate in a reactor;

a first introduction step of introducing, into the reactor, at least one silicon compound represented by the following Formula (1);

a first purge step of purging the reactor with purge gas;

a second introduction step of introducing an oxygen source into the reactor; and a second purge step of purging the reactor with the purge gas, wherein the first introduction step, the first purge step, the second introduction step, and the second purge step are performed at a temperature of 650° C. or more and 800° C. or less and a pressure of 7.6 Pa or more and 100 kPa or less:

[Chem. 1]

Formula (1)

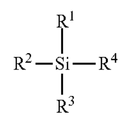

wherein, in Formula (1), $R^1$ is a methoxy group or an ethoxy group, $R^2$ is a hydrogen atom, a methyl group, an ethyl group, a methoxy group, or an ethoxy group, $R^3$ is a hydrogen atom, a methyl group, an ethyl group, a methoxy group, an ethoxy group, or a group represented by the following Formula (2) or (3), and $R^4$ is a group represented by the following Formula (2) or (3):

[Chem. 2]

Formula (2)

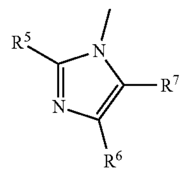

[Chem. 3]

Formula (3)

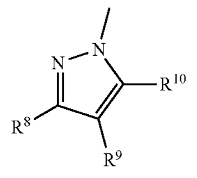

wherein, in Formulae (2) and (3), $R^5$ to $R^{10}$ are each independently a hydrogen atom, a methyl group, or an ethyl group.

2. The method for forming a silicon oxide film according to claim 1, wherein, in Formula (1), $R^1$ to $R^3$ are methoxy groups, and $R^4$ is a group represented by Formula (3).

3. The method for forming a silicon oxide film according to claim 1, wherein the first introduction step, the first purge step, the second introduction step, and the second purge step are repeated.

* * * * *